United States Patent
Polizzi et al.

(10) Patent No.: US 10,115,462 B2
(45) Date of Patent: Oct. 30, 2018

(54) ADDRESS DECODER FOR A NON-VOLATILE MEMORY ARRAY USING MOS SELECTION TRANSISTORS

(71) Applicant: STMicroelectronics S.r.l., Agrate Brianza (IT)

(72) Inventors: Salvatore Polizzi, Palermo (IT); Maurizio Francesco Perroni, Furnari (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/474,607

(22) Filed: Mar. 30, 2017

(65) Prior Publication Data

US 2018/0096727 A1    Apr. 5, 2018

(30) Foreign Application Priority Data

Sep. 30, 2016    (IT) .................. 102016000098496

(51) Int. Cl.
   *G11C 13/00*    (2006.01)

(52) U.S. Cl.
   CPC ........ *G11C 13/0069* (2013.01); *G11C 13/004* (2013.01); *G11C 13/0004* (2013.01); *G11C 13/0023* (2013.01); *G11C 13/0097* (2013.01)

(58) Field of Classification Search
   CPC .............................................. G11C 13/0069
   See application file for complete search history.

(56) References Cited

U.S. PATENT DOCUMENTS

| | | | | |
|---|---|---|---|---|
| 7,978,552 B2* | 7/2011 | Matsuoka | ................ | G11C 8/10 365/185.21 |
| 8,144,509 B2* | 3/2012 | Jung | .................. | G11C 11/1675 365/148 |
| 2003/0202374 A1* | 10/2003 | Hayashi | .................... | G11C 7/22 365/104 |
| 2005/0185445 A1 | 8/2005 | Osada et al. | | |
| 2007/0019490 A1* | 1/2007 | Kuroda | .................. | G11C 17/12 365/212 |
| 2008/0130379 A1* | 6/2008 | Ohsawa | .................... | G11C 8/08 365/189.11 |

(Continued)

*Primary Examiner* — Douglas King
(74) *Attorney, Agent, or Firm* — Slater Matsil, LLP

(57) ABSTRACT

An address decoder, for a non-volatile memory device provided with a memory array having memory cells arranged in word lines (WL) and bit lines (BL), each memory cell being having a memory element and an access element with a MOS transistor for enabling access to the memory element. Source terminals of the MOS transistors of the access elements of the memory cells of a same word line are connected to a respective source line. The address decoder has a row-decoder circuit and a column-decoder circuit, for selecting and biasing the word lines and the bit lines, respectively, of the memory array with row-driving signals ($V_{WL}$) and column-driving signals ($V_{BL}$), respectively. The address decoder has a source-decoder circuit for generating source-driving signals ($V_{SL}$) for biasing the source lines of the memory array, on the basis of the logic combination of the row-driving signals of associated word lines.

20 Claims, 5 Drawing Sheets

(56) References Cited

U.S. PATENT DOCUMENTS

| | | | |
|---|---|---|---|
| 2010/0046310 A1* | 2/2010 | Joo | G11C 11/406 365/203 |
| 2012/0327708 A1* | 12/2012 | Du | G11C 13/0004 365/163 |
| 2013/0215669 A1* | 8/2013 | Haukness | G11C 13/0007 365/148 |
| 2014/0269064 A1 | 9/2014 | Jeon et al. | |
| 2017/0084334 A1 | 3/2017 | Polizzi et al. | |

\* cited by examiner

ADDRESS DECODER FOR A NON-VOLATILE MEMORY ARRAY USING MOS SELECTION TRANSISTORS

CROSS-REFERENCE TO RELATED APPLICATIONS

This application claims priority to Italian Application No. 102016000098496 filed on Sep. 30, 2016, which application is hereby incorporated herein by reference.

TECHNICAL FIELD

The present invention relates generally to memories, and, in particular embodiments, to address decoders for a non-volatile memory array.

BACKGROUND

As it is known, PCM memories represent a new generation of embedded memories, in which the features of materials having the property of switching between phases having different electrical characteristics are exploited to store information. These materials may switch between a disorderly amorphous phase and an orderly crystalline or polycrystalline phase, and resistivity of a considerably different value, which consequently correspond to a different value of a datum stored, are associated to the two phases.

For example, the elements of Group VI of the periodic table, such as tellurium (Te), selenium (Se), or antimony (Sb), called chalcogenides or chalcogenic materials, may advantageously be used in the manufacturing of phase-change memory cells. In particular, an alloy made up of germanium (Ge), antimony (Sb), and tellurium (Te), known as GST (having a chemical composition $Ge_2Sb_2Te_5$) currently finds a wide use in such memory cells.

Phase changes may be obtained by local increase of the temperature of the cells of chalcogenic material, through resistive electrodes (generally known as "heaters"), arranged in contact with respective regions of chalcogenic material.

Access elements, in particular MOS transistors, are connected to the heaters, and selectively enable passage of a programming electric current through a respective heater. This electric current, by the Joule effect, generates the temperatures required for phase change. In particular, when the chalcogenic material is in the high-resistivity amorphous state (the so-called RESET state), it is required to apply a current/voltage pulse (or an appropriate number of such pulses) of a duration and amplitude such as to enable the chalcogenic material to cool slowly. Subjected to this treatment, the chalcogenic material changes its state and switches from the high-resistivity state to a low-resistivity state (the so-called SET state). Instead, when the chalcogenic material is in the SET state, it is required to apply a current/voltage pulse of an appropriate duration and with a high amplitude for causing the chalcogenic material to return into the high-resistivity amorphous state (RESET state).

During reading, the state of the chalcogenic material is detected by applying a voltage sufficiently low as not to cause a relevant heating thereof, and then reading the value of the current flowing in the memory cell (which is once again selected by the respective access MOS transistor). Since the current is proportional to the conductivity of the chalcogenic material, it is possible to determine in which state the material is, and thus to identify the datum stored in the memory cell.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Embodiments of the present invention relate to an address decoder for a non-volatile memory array using MOS selection transistors, for addressing and biasing corresponding memory cells during programming and reading operations. In particular, in what follows reference will be made, without this implying any loss of generality, to a so-called PCM (Phase-Change Memory) or ePCM (embedded Phase-Change Memory) memory array.

In general, PCM memories afford considerable advantages, amongst which a high scalability and reading rate combined with a reduced current consumption and a high efficiency. Due to these advantages, at least in some fields, it is justified to consider that PCM memories may replace traditional non-volatile memories, for example of a flash type.

Figure 1:
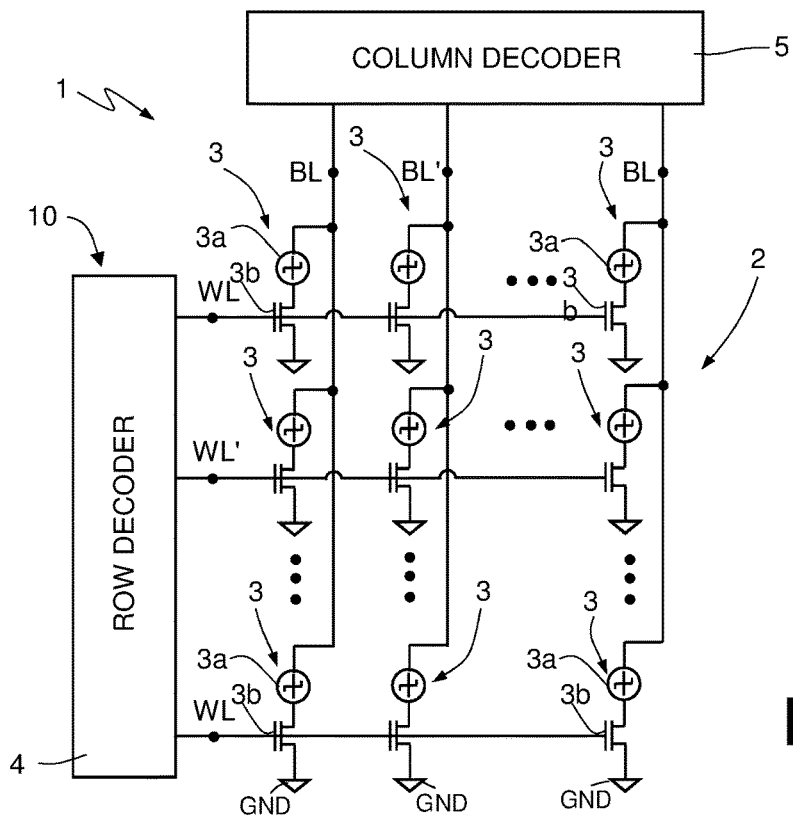
FIG. 1 shows a general block diagram of a non-volatile memory device, of a known type, with the corresponding address decoder.

In greater detail, and as shown schematically in FIG. 1, a non-volatile memory device, designated by 1, comprises a memory array 2 made up of a plurality of memory cells 3, arranged in word lines WL, and bit lines BL. In a per se known manner, not discussed in detail herein, the memory array 2 is divided into sectors, which may be addressed separately, each having a respective number of word lines WL and bit lines BL.

Each memory cell 3 is constituted by a memory element 3a and an access element 3b, connected in series between a respective bit line BL and a reference line (set at the ground reference voltage, GND).

The memory element 3a includes a phase-change material (for example, a chalcogenide, such as GST), and is thus able to store data in the form of resistance levels associated to the various phases assumed by the material.

The access element 3b is a MOS transistor having its gate terminal connected to a respective word line WL, its drain terminal connected to the memory element 3a, via a corresponding heater element, and its source terminal connected to the reference line (which, for this reason, is referred to in what follows as "source line SL").

The access element 3b is controlled and biased for enabling, when selected, passage of a reading/programming (modifying) current through the memory element 3a, of an appropriate value during respective reading/programming operations.

In particular, a word line WL connects together the gate terminals of access elements 3b aligned along a same row. Likewise, a source line SL connects the source terminals of access elements 3b aligned along a same row.

The non-volatile memory device 1 further comprises an address decoder 10, which includes a row-decoder stage 4 and a column-decoder stage 5, which enable selection, on the basis of address signals received at their input (designated in general by AS), of the memory cells 3, and in particular of the corresponding word lines WL and bit lines BL, each time addressed, enabling biasing thereof to appropriate voltage and current values during the programming operations (SET or RESET) and/or the reading operations.

In particular, the row-decoder stage 4 may be made as described in detail in U.S. patent application Ser. No. 15/083,056 filed on Mar. 28, 2016 in the name of the present Applicant.

A word line WL' and a bit line BL', selected by the row-decoder and column-decoder stages 4, 5 for addressing a memory cell 3' of the memory array 2, are represented, by way of example, in FIG. 1; in the example, the other word lines WL and the other bit lines BL of the same sector of the memory array 2 are not selected.

Figure 2:
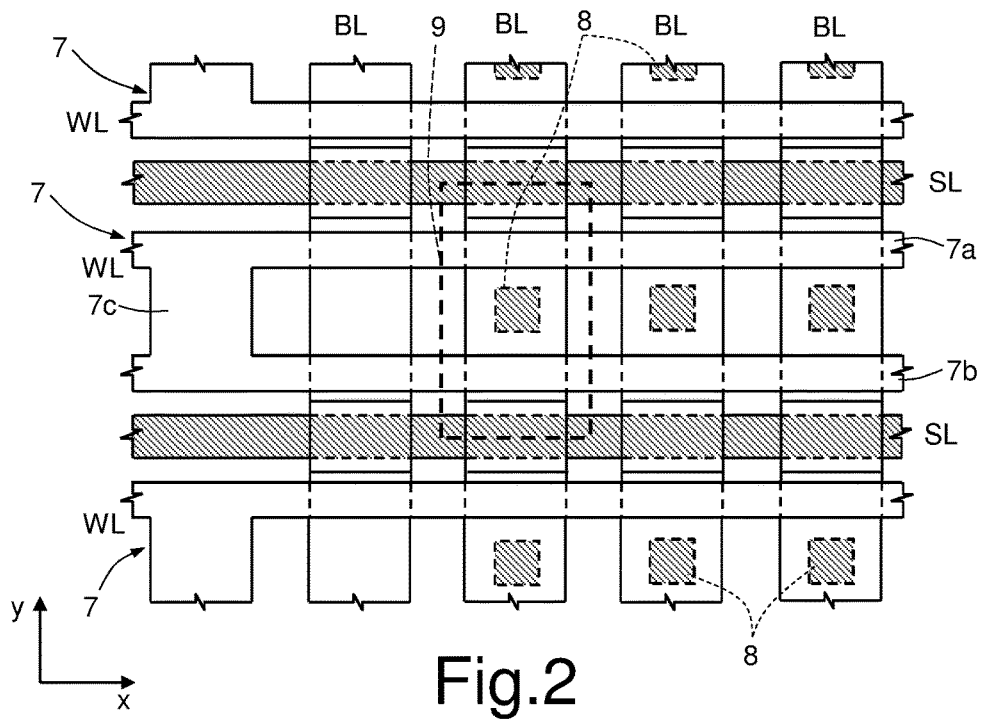
FIG. 2 shows in a simplified way the manufacturing layout of a portion of the memory array of the device of FIG. 2.

As shown in FIG. 2, the MOS transistors of the access elements 3b may be made with a layout envisaging gate lines 7 (which define the word lines WL) split into two, each having a first portion 7a and a second portion 7b, which face a respective source line SL, and a connection portion 7c arranged at a first end portion of the same gate line 7. Each source line SL thus faces, and is shared between, two adjacent word lines WL in the memory array 2.

FIG. 2 also shows the bit lines BL and the contacts 8 of the same bit lines BL with heater elements 9 (shown schematically) of each memory cell 3. Each heater element 9 is (in a way not shown herein) in turn coupled to the corresponding phase-change memory element 3a of the corresponding memory cell 3.

The gate lines 7 and the source lines SL extend parallel to one another along a first horizontal axis x. The bit lines BL extend in a direction transverse to the gate lines 7 and source lines SL, along a second horizontal axis y (the first and second horizontal axes x, y defining a horizontal plane xy, which corresponds to the plane of the layout of FIG. 2).

The present Applicant has realized that the decoding solution described, albeit advantageous, has some problems.

In particular, as may be noted from an examination of the aforesaid FIG. 1, in the non-selected memory cells 3 (i.e., belonging to word lines WL not selected for the programming or reading operations) that are in the same bit line BL' as that of the selected memory cell 3', non-negligible leakage currents may arise.

The MOS transistors of the access elements 3b of the above non-selected memory cells 3 have, in fact, gate and source voltages that are substantially zero and drain voltages equal to the biasing voltage of the bit line BL' that has been selected for the programming or reading operations. Consequently, a voltage difference, for example, in the region of 0.7 V, is originated between the drain and source terminals and may generate the aforesaid leakage currents.

The above phenomenon may be particularly relevant in the case where the memory array 2 has sectors of large dimensions (each containing a large number of memory cells 3 arranged in respective word lines WL and bit lines BL) and/or in the case where the MOS transistors of the access elements 3b have small channel dimensions (for example, equal to or less than 30 nm). The increase in dimensions of the sectors of the memory array 2 entails, in fact, a corresponding increase in the number of non-selected memory cells 3 in which the leakage effect may occur, and the reduction in the constructional dimensions of the same memory cells 3 contributes to an increase in the value of the leakage currents.

Address decoders of known memory devices may thus not be altogether satisfactory, in particular as regards the electrical performance in terms of leakage currents. Likewise, the use of these address decoders may not enable manufacturing of memory devices with the desired sector dimensions, or the desired dimensions of the MOS transistors used for selection of the memory cells.

Embodiments of the present invention solve, at least in part, the problems highlighted previously in order to provide an address-decoding solution having improved electrical performance.

According to the present invention, an address decoder and a corresponding non-volatile memory device are provided, as defined in the annexed claims.

As will be described in detail hereinafter, one aspect of the present solution envisages introduction, in the address decoder associated to the memory array of a non-volatile memory device, of an additional source-decoder stage, which is designed to bias the source lines SL at appropriate voltage values during the memory operations.

In particular, this source-decoder stage is designed to have a simple decoding scheme, directly based upon a logic combination of row-driving signals supplied to the associated word lines by the row-decoder stage.

Figure 3:
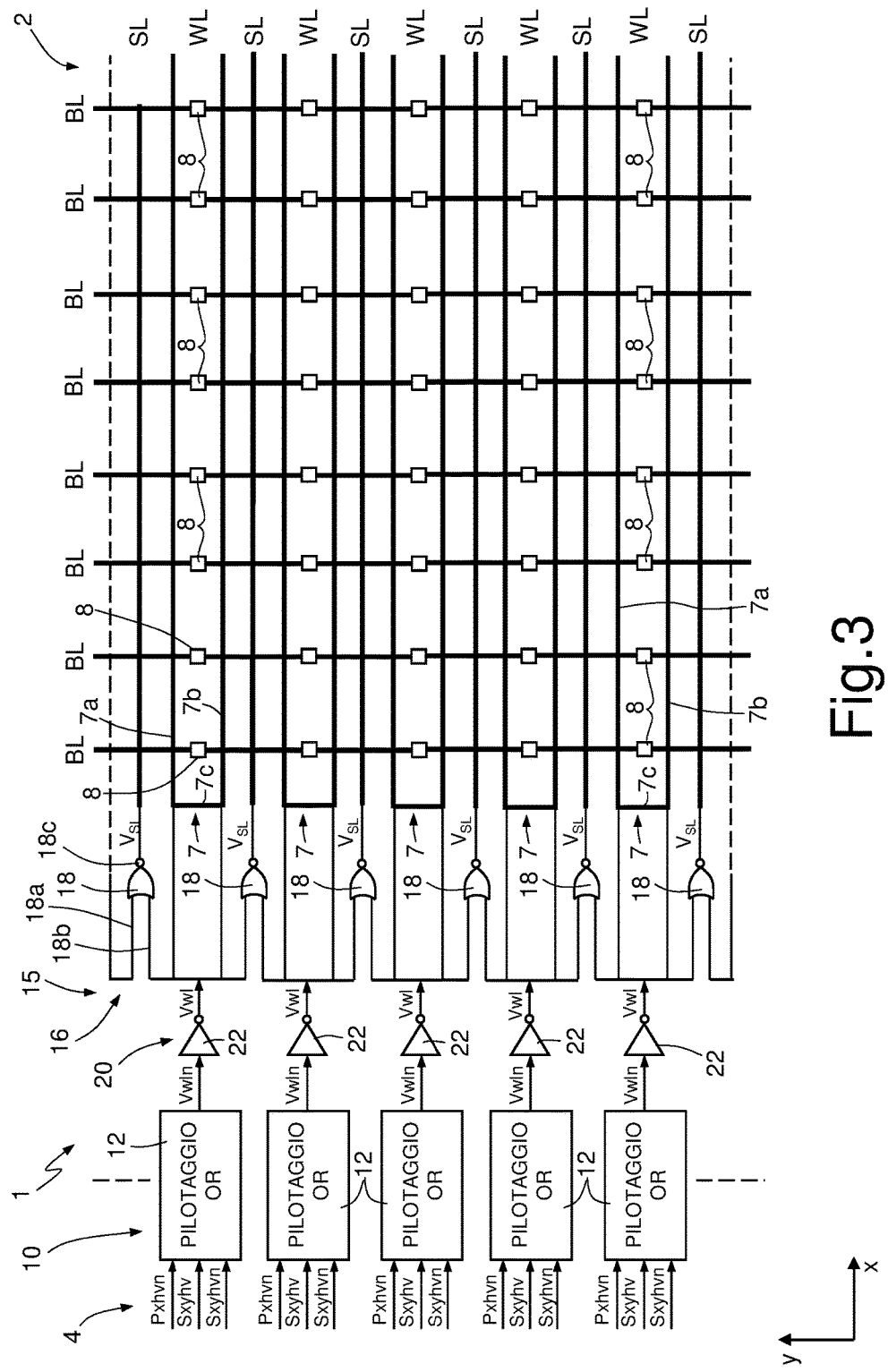
FIG. 3 is a block diagram of an address decoder for the non-volatile memory device, according to a first embodiment of the present solution.

In detail, FIG. 3 shows a memory device, once again designated by 1 (in general, same reference numbers are used here to designate elements that are similar to others already described previously), which comprises, in a way similar to what has been described previously with reference to FIGS. 1 and 2, the memory array 2 constituted by the plurality of memory cells 3 (each constituted by the respective memory element 3a, for example of a PCM type, and by the respective access element 3b, in particular formed by the respective MOS transistor, here not shown for simplicity).

The memory device 1 further comprises the address decoder 10, which in turn comprises the row-decoder stage 4 and the column-decoder stage 5 (here not shown), which enable selection and biasing of the word lines WL and bit lines BL each time addressed.

As mentioned previously, the row-decoder stage 4 is in the example obtained as described in detail in U.S. patent application Ser. No. 15/083,056 filed on Mar. 28, 2016 in the name of the present Applicant.

The row-decoder stage 4 (of which only a portion is represented, for simplicity of illustration) here has an output driving module 12, based upon an OR logic, which generates negated row-driving signals $V_{\overline{WLn}}$, on the basis of address-decoding signals received at its input (in the example, designated by Pxhvn, Sxyhv and Sxyhvn, generated, as described in the aforesaid patent application, by predecoding modules of the row-decoder stage 4, here not shown).

The schematic representation of FIG. 3 show the word lines WL, once again having a configuration with gate line 7 split into the two portions 7a, 7b (connected together by the connection portion 7c); the source lines SL, once again shared between two adjacent word lines WL; and the bit lines BL. The contacts 8 of the bit lines BL with the heater elements of the memory cells 3 are also shown schematically.

According to one aspect of the present solution, the address decoder 10 further comprises a source-decoder stage 15, having a plurality of inputs coupled to the word lines WL and a plurality of outputs coupled to the source lines SL, and configured to properly bias the source lines SL as a function of the biasing values of the associated word lines WL.

The source-decoder stage 15 is configured for generating source-driving signals $V_{SL}$ for the source lines SL, based on a logic combination operation, in particular of a NOR type, of row-driving signals $V_{WL}$ (of a value inverted with respect to the negated row-driving signals $V_{WLn}$) of the associated word lines WL.

In greater detail, the source-decoder stage 15 comprises a logic-combination module 16, which in this embodiment includes a plurality of first NOR logic gates 18, each of which supplies at its output a source-driving signal $V_{SL}$ for a respective source line SL, on the basis of the NOR logic combination of the row-driving signals $V_{WL}$ of the associated word lines WL, received at the input.

In the embodiment illustrated in FIG. 3, the logic-combination module 16 comprises a number of first NOR logic gates 18 equal to the number of the source lines SL of the memory array 2. In other words, a respective first NOR logic gate 18 is associated to each source line SL, being designed to generate the respective source-driving signal $V_{SL}$.

In particular, each first NOR logic gate 18 has an output 18c coupled to the respective source line SL, and a first input 18a and a second input 18b coupled to the word lines WL adjacent to the same source line SL in the memory array 2 (i.e., arranged in a position facing the source line SL).

In this embodiment, the source-decoder stage 15 further comprises a logic-inverter module 20, coupled between the output of the row-decoder stage 4 (and thus receiving the negated row-driving signals $V_{WLn}$) and the input of the logic-combination module 16, to which it supplies the row-driving signals $V_{WL}$.

The logic-inverter module 20 comprises a number of inverters 22 equal to the number of the word lines WL of the memory array 2, each inverter 20 operating as an inverting buffer and generating a row-driving signal $V_{WL}$ starting from the respective negated row-driving signal $V_{WLn}$.

It may immediately be noted that, during operation, the source-decoder stage 15 biases the source lines SL, associated to a word line WL that is selected for (reading or programming) memory operations, to the ground reference voltage (or, in general, to a voltage having a low logic-value).

In fact, the row-driving signal $V_{WL}$ at the first input 18a and/or the second input 18b of the first NOR logic gate 18 coupled to each of the aforesaid source lines SL associated to the selected word line WL has a high logic value, so that the source-driving signal $V_{SL}$ at the output from the same NOR logic gate 18 has a low value.

Instead, the source-decoder stage 15 biases the source lines SL associated to the remaining word lines WL of the sector of the memory array 2, which are not selected for the (reading or programming) memory operations, to a biasing voltage (designated in what follows by $V_B$) of a value chosen appropriately as a function of the value of the column-driving signal $V_{BL}$ at which the selected bit line BL is set. Advantageously, the aforesaid value of the biasing voltage $V_B$ is close, or equal to, the value of the column-driving signal $V_{BL}$.

The row-driving signal $V_{WL}$ at the first and second inputs 18a, 18b of the first NOR logic gate 18 that is coupled to each of the aforesaid source lines SL associated to the non-selected word lines WL has, in fact, a low logic value, so that the source-driving signal $V_{SL}$ at the output from the same NOR logic gate 18 has a high logic value (equal to the value of the biasing voltage $V_B$).

Figure 4:
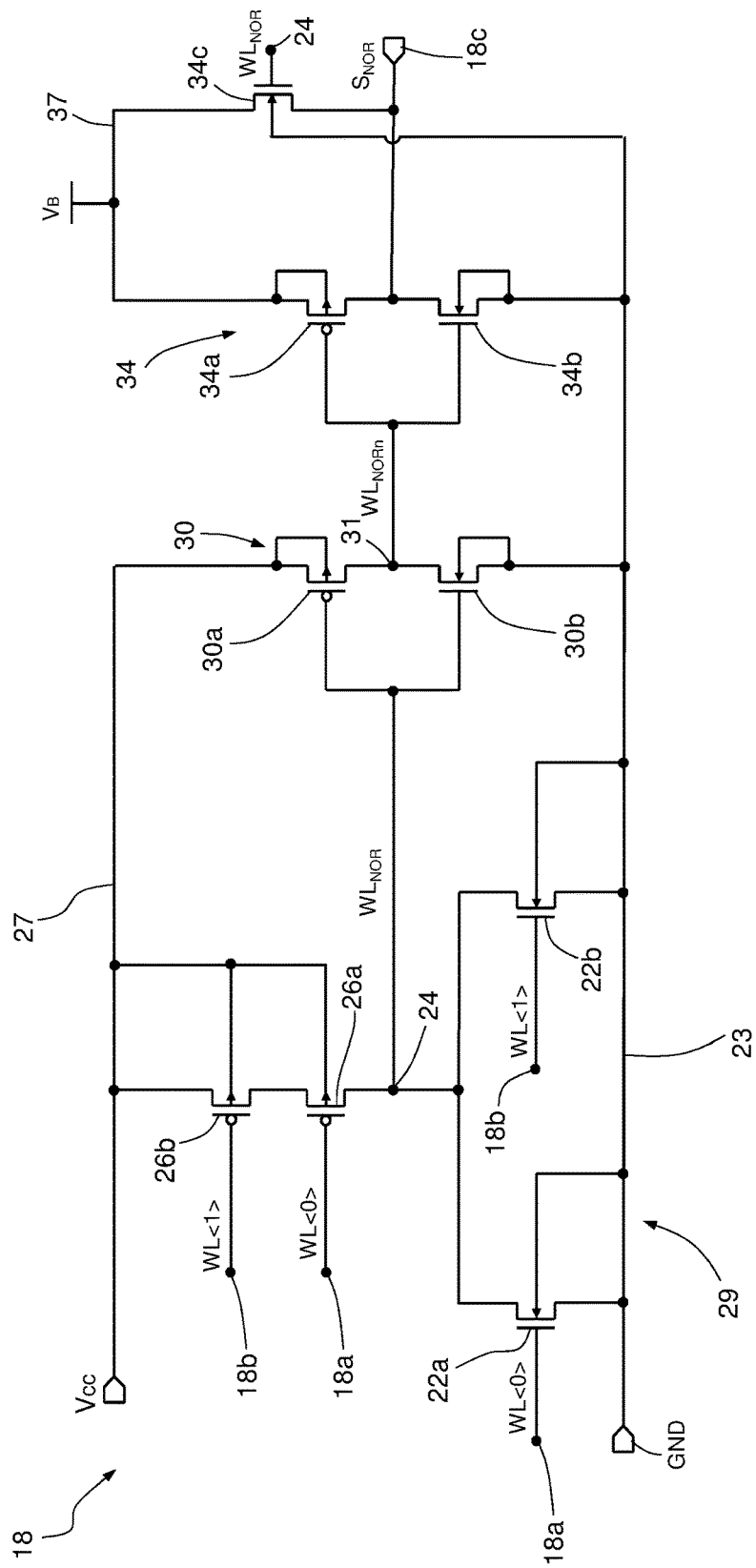
FIG. 4 is a circuit diagram of a logic-combination gate in the address decoder of FIG. 3.

With reference to FIG. 4, a possible circuit implementation is now discussed of one of the first NOR logic gates 18, which, by way of example, receives a first row-driving signal $V_{WL<0>}$ and a second row-driving signal $V_{WL<1>}$.

In detail, the first NOR logic gate 18 comprises a first pair of input transistors 22a, 22b, of a NMOS type, connected in parallel between a first reference line 23, set at the ground reference voltage GND (which is substantially zero), and a first internal node 24. In particular, a first NMOS input transistor 22a has its respective gate terminal connected to the first input 18a of the first NOR logic gate 18 and receives the first row-driving signal $V_{WL<0>}$, and the second NMOS input transistor 22b has its respective gate terminal connected to the second input 18b of the same first NOR logic gate 18 and receives the second row-driving signal $V_{WL<1>}$.

The first NOR logic gate 18 further comprises a second pair of input transistors 26a, 26b, of a PMOS type, connected in series between the first internal node 24 and a second reference line 27, set, for example, at a supply voltage $V_c$, supplying the non-volatile memory device 1 (having a value greater than the aforesaid ground reference voltage GND, for example 1.8 V).

In particular, a first PMOS input transistor 26a has its respective gate terminal connected to the first input 18a of the first NOR logic gate 18 and receives the first row-driving signal $V_{WL<0>}$, and the second PMOS input transistor 26b has its respective gate terminal connected to the second input 18b of the same first NOR logic gate 18 and receives the second row-driving signal $V_{WL<1>}$.

The first and second pairs of input transistors, 22a-22b, 26a-26b jointly provided a NOR logic-combination module 29 implementing the operation of NOR logic combination of the row-driving signals $V_{WL<0>}$ and $V_{WL<1>}$ received at the input, and supplies at the output, on the first internal node 24, a logic-combination signal $WL_{NORn}$.

The first NOR logic gate 18 further comprises a first logic inverter 30, having its input connected to the first internal node 24, and consequently receiving the logic-combination signal $WL_{NOR}$, and its output connected to a second internal node 31, on which it supplies the negated version of the same logic-combination signal $WL_{NORn}$.

In particular, the first logic inverter 30 is formed by a first pair of transistors: a pull-up PMOS transistor 30a, which is connected between the second reference line 27 and the second internal node 31 and has its control terminal connected to the first internal node 24; and a pull-down NMOS transistor 30b, which is connected between the second internal node 31 and the ground reference line 23, and has its control terminal that is also connected to the first internal node 24.

The first NOR logic gate 18 further comprises a second logic inverter 34, which has its input connected to the second internal node 31, and consequently receives the negated version of the logic-combination signal $WL_{NORn}$, and its output connected to the respective output 18c of the first NOR logic gate 18, on which it supplies a NOR output signal $S_{NOR}$ for generation of the source-driving signal $V_{SL}$, which constitutes the further negation of the aforesaid negated version of the logic-combination signal $WL_{NORn}$.

In particular, the second logic inverter 34 is formed by: a pull-up PMOS transistor 34a, which is connected between a third reference line 37, set at the biasing voltage $V_B$ that defines the value of the source-driving signal $V_{SL}$, and the output 18c of the first logic gate 18, and has its control terminal connected to the second internal node 31; and a pull-down NMOS transistor 34b, which is connected between the output 18c and the ground reference line, and has its control terminal that is also connected to the second internal node 31.

According to one aspect of the present solution, the second logic inverter 34 further comprises a further pull-up NMOS transistor 34c, which is connected in parallel to the pull-up PMOS transistor 34a between the third reference line 37 and the output 18c, and has its control terminal connected to the first internal node 24, from which it receives the logic-combination signal $WL_{NOR}$.

In use, the joint presence of the first and second logic inverters 30, 34, arranged in series with respect to one another, advantageously enables increase in the driving capacity of the first logic gate 18, at the same time not varying the logic value of the NOR output signal $S_{NOR}$, to which corresponds the (high or low) value of the source-driving signal $V_{SL}$.

Furthermore, the presence of the further pull-up NMOS transistor 34c in the second logic inverter 34, at the output 18c, advantageously enables biasing of the source line SL also with low voltage values, even lower than the threshold voltage of the pull-up PMOS transistor 34a.

Figure 5:
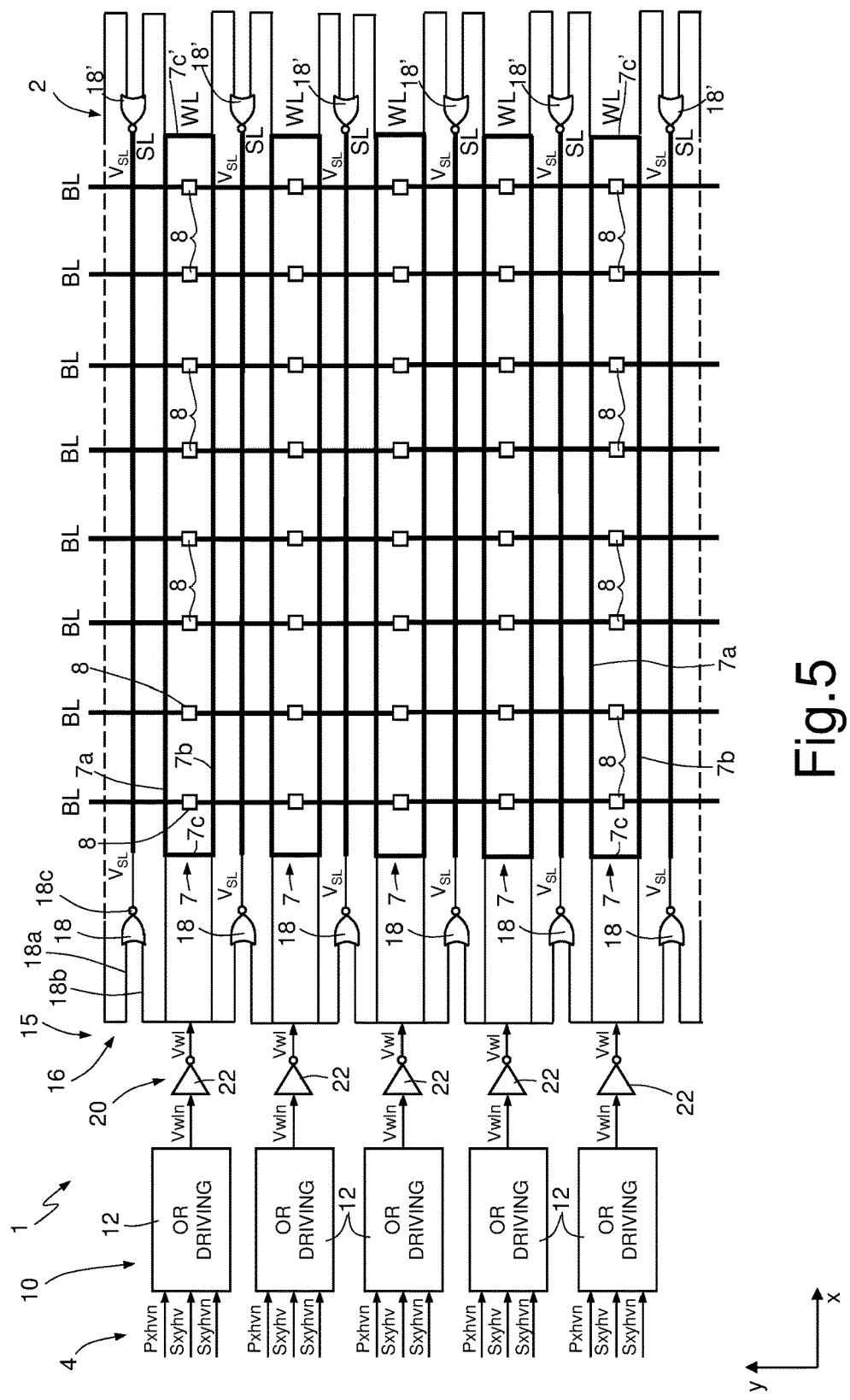
FIG. 5 is a block diagram of an address decoder for the non-volatile memory device, according to a second embodiment of the present solution.

With reference to FIG. 5, a further embodiment of the address decoder 10 is now described, which differs with respect to the implementation of the source-decoder stage 15.

In this case, the logic-combination module 16 of the source-decoder stage 15 further comprises a plurality of second NOR logic gates 18', each of which supplies at its output the source-driving signal $V_{SL}$ for a respective source line SL, on the basis of the NOR logic combination of the row-driving signals $V_{WL}$ of the adjacent word lines WL, received at the input (thus in a way similar to the first NOR logic gates 18).

In particular, each gate line 7 here comprises a second connection portion 7c' arranged at a second end portion of the same gate line 7, opposite to the first end portion 7c along the first horizontal axis x.

In particular, the first NOR logic gates 18 are electrically coupled at the input to a first end portion of the word lines WL (at the aforesaid first connection portion 7c of the gate line 7) and at the output to a corresponding first portion of the source line SL, and the second NOR logic gates 18' are electrically coupled at the input to a second end portion of the word lines WL (at the aforesaid second connection portion 7c' of the gate line 7) and at the output to a corresponding second portion of the source line SL (which is also opposite to the first portion along the first horizontal axis x).

In this embodiment, the joint presence of the first and second NOR logic gates 18, 18' advantageously allows to improve the driving capacity of the source line SL, by the source-driving signals $V_{SL}$.

Figure 6:
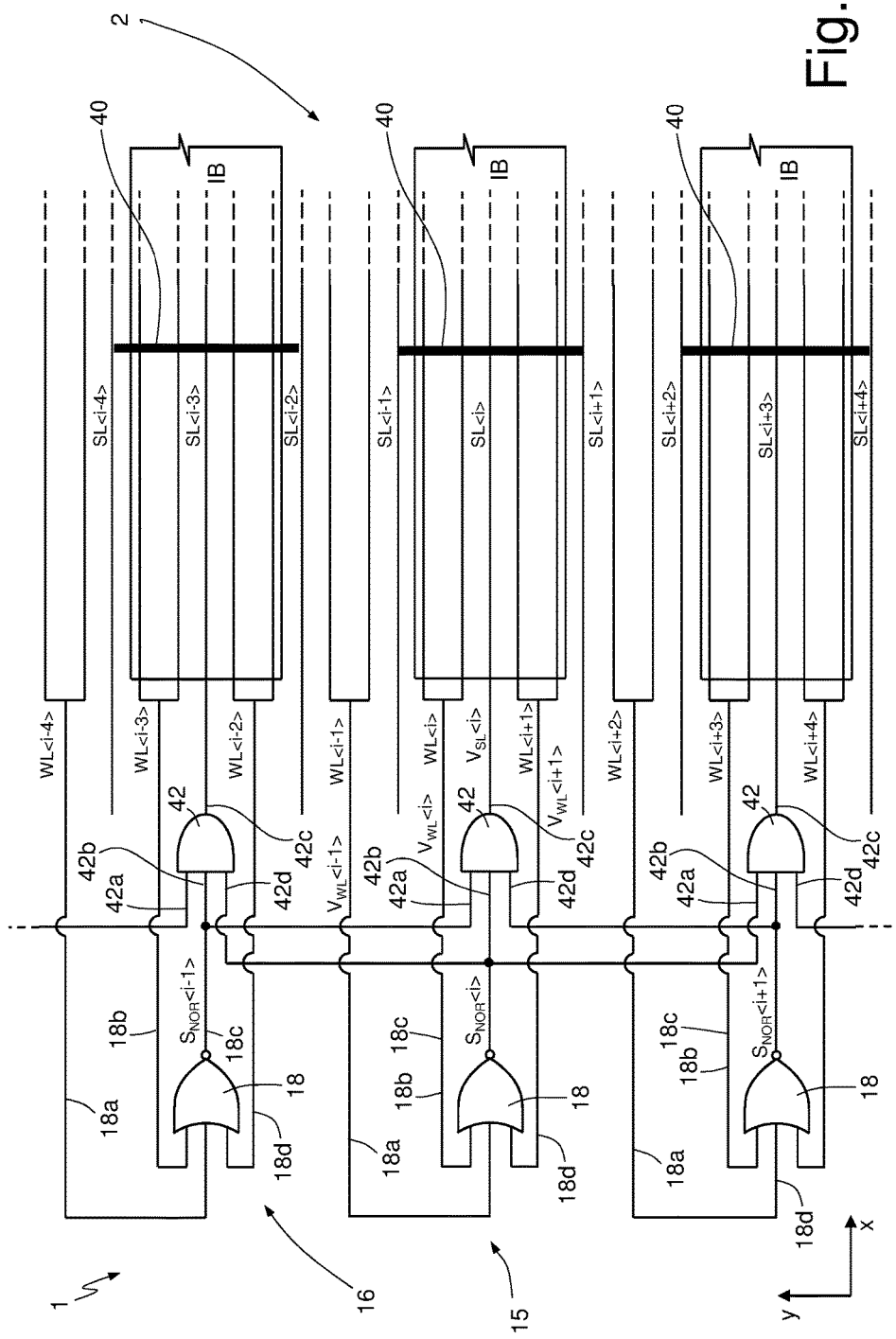
FIG. 6 shows a block diagram of an address decoder for the non-volatile memory device, according to a third embodiment of the present solution.

With reference to FIG. 6, a further embodiment of the source-decoder stage 15 is now described (only the elements of the memory device 1 required for an understanding of the aforesaid further embodiment are shown in FIG. 6, for reasons of clarity of illustration).

In particular, adjacent source lines SL of the memory array 2 are electrically shorted with respect to one another in groups, by respective metallization strips 40, which extend in a direction transverse to the source lines SL (in the example, along the second horizontal axis y). In the example, these groups comprise a number of source lines SL adjacent to one another equal to three.

Advantageously, these metallization strips 40 may be obtained by the metallization layer (designated by IB in FIG. 6), being thick and wide, used for the interconnections in the silicon die in which the memory device 1 is made. In this way, it is possible to minimize the resistance of the source lines SL and the possible voltage drops during the reading and/or programming operations.

In this way, only one source line SL of each group is biased by the source-biasing signal $V_{SL}$. Thus, in this case, the source-decoder stage 15 comprises a single first NOR logic gate 18 (and possibly a second one, arranged at the opposite end of the row with respect to the horizontal axis x, as discussed previously) for each group of source lines SL shorted with respect to one another, which receives at input the row-driving signals $V_{WL}$ of the word lines WL adjacent to the source lines SL of the same group, and generates a NOR logic-combination signal $S_{NOR}$.

In the example shown, each first NOR logic gate 18 has three inputs 18a, 18b, 18d coupled to respective word lines WL, and an output 18c that supplies the aforesaid NOR logic-combination signal $S_{NOR}$.

In greater detail, considering the group of shorted source lines SL<i−1>, SL<i>, and SL<i+1>, the first input 18a of the associated first logic gate 18 receives the row-driving signal $V_{WL}$<i−1> of the word line WL<i−1>, the second input 18b receives the row-driving signal $V_{WL}$<i> of the word line WL<i>, and the third input 18c of the same first logic gate 18 receives the row-driving signal $V_{WL}$<i+1> of the word line WL<i+1>. The NOR logic-combination signal $S_{NOR}$<i> is in this case given by the NOR logic combination of the row-driving signals $V_{WL}$<i−1>, $V_{WL}$<i>, and $V_{WL}$<i+1>.

In this embodiment, the source-decoder stage 15 further comprises, once again for each group of source lines SL, an AND logic gate 42 (likewise, also in this case, a further AND logic gate, not illustrated, could be provided for each group, arranged at the opposite end of the row with respect to the horizontal axis x, as discussed previously, in order to increase the driving capacity).

The AND logic gate 42 receives at the input the NOR output signal $S_{NOR}$ generated by the first NOR logic gate 18 associated to the same group of source lines SL, and also further NOR output signals $S_{NOR}$ generated by the respective first NOR logic gates 18 associated (in a way similar to what has been discussed previously) to adjacent groups of source lines SL.

In the example shown, each AND logic gate 42 has three inputs 42a, 42b, 42d coupled to the outputs 18c of respective first NOR logic gates 18, and a respective output 42c, coupled to the source line SL that is biased in the respective group and supplying the respective source-biasing signal $V_{SL}$.

In detail, considering once again the source line SL<i>, the AND logic gate 42 receives at the inputs 42a, 42b, 42d, respectively, the NOR logic-combination signals $S_{NOR}$<i−1>, $S_{NOR}$<i>, and $S_{NOR}$<i+1>, and generates, via the operation of AND logic combination, the source-biasing signal $V_{SL}$<i>.

As will be clear, in this embodiment, when any one of the word lines WL associated to a group of source lines SL is selected (brought to the high value), the low logic value of the resulting NOR output signal $S_{NOR}$ entails the corresponding low value of the source-biasing signal $V_{SL}$ of the same group and of the adjacent groups of source lines SL.

Consequently, not only are the source lines SL of the same group brought to the low value, but also the source lines of the adjacent groups. In particular, in the example shown, a number of sources lines SL equal to nine are simultaneously brought to the low value. The remaining source lines SL are, instead, brought to the high value, i.e., to the desired biasing value (given by the biasing voltage $V_B$).

This embodiment thus advantageously enables a saving of area in the embedded or integrated implementation (thanks to the reduction in the number of logic gates), at the expense, however, of a slight increase in the residual leakage current, due to the higher number of source lines SL that are biased at the low value for a same bit line BL of the memory cell 3 selected for the storage operations.

The advantages of the address decoder emerge clearly from the foregoing description.

In any case, it is again underlined that the solution proposed enables minimization, or in any case considerable reduction, of the leakage currents within the non-volatile memory device, proving in particular useful in the case of memory devices having sectors with a large number of word lines and/or having selection transistors of reduced dimensions.

Likewise, given the same electrical performance, it is possible, thanks to the solution proposed, to increase the number of word lines in each sector, thus optimizing exploitation of area in the embedded implementation of the non-volatile memory device.

Finally, it is clear that modifications and variations may be made to what has been described and illustrated herein, without thereby departing from the scope of the present invention, as defined in the annexed claims.

In particular, it is once again emphasized that the solution described may find advantageous application in a wide range of non-volatile memory devices (for example, embedded or stand-alone flash devices), in which MOS transistors are used for selection and biasing of the corresponding memory cells.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An address decoder for a non-volatile memory device comprising:
    a row-decoder circuit configured to select and bias word lines of a plurality of word lines of a memory array with row-driving signals (VWL), the-memory array comprising memory cells arranged using the plurality of word lines and a plurality of bit lines, wherein
        each memory cell comprises a memory element and an access element, wherein each access element includes a MOS transistor to enable access to the memory element,
        respective source terminals of the MOS transistors of a same word line of the plurality of word lines are connected to respective source lines of a plurality of source lines of the memory array, and
        a total number of the plurality of source lines of the memory array is greater than or equal to a total number of the plurality of word lines of the memory array;
    a column-decoder circuit configured to select and bias the bit lines of the plurality of bit lines of the memory array with column-driving signals (VBL); and
    a source-decoder circuit configured to generate source-driving signals (VSL) for biasing the plurality of source lines of the memory array based on a logic combination of row-driving signals (VWL) of associated subsets of the plurality of word lines.

2. The address decoder according to claim 1, wherein the source-decoder circuit comprises a logic-combination circuit configured to carry out a NOR logic combination of the row-driving signals, and wherein the logic-combination circuit comprises a plurality of first NOR logic gates, each comprising:
    inputs connected to a respective associated subset of the plurality of word lines, the inputs being configured to receive the row-driving signals (VWL) of the respective associated subset of the plurality of word lines; and
    an output electrically coupled to a respective source line, the output being configured to generate a NOR output signal (SNOR) for generation of a respective source-driving signal (VSL) for biasing the respective source line.

3. The address decoder according to claim 2, wherein:
    each of the plurality of source lines comprises a first end portion and a second end portion and extends along a longitudinal axis (x) from the first end portion to the second end portion;
    the output of each of the plurality of first NOR logic gates is electrically coupled to the first end portion of the respective source line;
    the logic-combination circuit further comprises a plurality of second NOR logic gates, each corresponding to one of the plurality of first NOR logic gates; and
    each of the plurality of second NOR logic gates comprises
        inputs connected to the respective associated subset of the plurality of word lines that are connected to the corresponding one of the plurality of first NOR logic gates, and
        an output electrically coupled to the second end portion of the respective source line that is connected to the corresponding one of the plurality of first NOR logic gates, the output being configured to generate the respective source-driving signal (VSL) for biasing the respective source line.

4. The address decoder according to claim 2, wherein each of the plurality of first NOR logic gates comprises:
    a NOR logic-combination circuit configured to implement an operation of a NOR logic combination of the row-driving signals (VWL) of the associated subsets of the plurality of word lines and supplies a logic-combination signal (WLNOR) on a first internal node;
    a first logic-inverter circuit having its input connected to the first internal node and its output connected to a second internal node, on which it supplies the negated version of the logic-combination signal (WLNORn); and
    a second logic-inverter circuit having its input connected to the second internal node and its output connected to the output of the respective first NOR logic gate, on which it supplies the NOR output signal (SNOR) for generation of the respective source-driving signal (VSL) for biasing the respective source line.

5. The address decoder according to claim 4, wherein said second logic-inverter circuit comprises:
a pull-up PMOS transistor connected between a reference line, set at a biasing voltage (VB), and said output, and has its control terminal connected to the output of said first logic-inverter circuit;
a pull-down NMOS transistor connected between said output and a ground reference line, and has its control terminal which is also connected to the output of said first logic-inverter circuit; and
a further pull-up NMOS transistor connected in parallel to the pull-up PMOS transistor and has its control terminal connected to the input of the first logic-inverter circuit.

6. The address decoder according to claim 5, wherein subsets of the plurality of source lines are electrically shorted in groups by respective metallization strips, wherein each subset comprises a number of source lines that is at least three and is less than the total number of the plurality of source lines.

7. The address decoder according to claim 2, wherein subsets of the plurality of source lines are electrically shorted in groups by respective metallization strips, wherein each subset comprises a number of source lines that is at least three and is less than the total number of the plurality of source lines.

8. The address decoder according to claim 7, wherein said logic-combination circuit comprises, for each of the groups:
a first NOR logic gate having inputs configured to receive the row-driving signals (VWL) of each of the plurality of word lines that are adjacent to source lines of the group, and an output configured to generate a NOR output signal (SNOR); and
an AND logic gate having inputs configured to receive the NOR output signals (SNOR) of the first NOR logic gates of the respective group and of the adjacent groups of source lines, and an output configured to generate the respective source-driving signal (VSL) for biasing the shorted source lines of the group.

9. The address decoder according to claim 1, wherein:
each source line is shared by a pair of adjacent word lines;
each associated subset of the plurality of word lines comprises a respective pair of adjacent word lines;
the source-decoder circuit comprises a logic-combination circuit configured to carry out a NOR logic combination of the row-driving signals; and
the logic-combination circuit comprises a plurality of first NOR logic gates, each comprising
a first input and a second input connected to a respective pair of adjacent word lines and that are configured to receive the row-driving signals (VWL) of the respective pair of adjacent word lines, and
an output electrically coupled to a respective source line, the output being configured to generate a respective source-driving signal (VSL) for biasing the respective source line.

10. The address decoder according to claim 9, wherein:
each of the plurality of source lines comprises a first end portion and a second end portion and extends along a longitudinal axis (x) from the first end portion to the second end portion;
the output of each of the plurality of first NOR logic gates is electrically coupled to the first end portion of the respective source line;
the logic-combination circuit further comprises a plurality of second NOR logic gates, each corresponding to one of the plurality of first NOR logic gates; and
each of the plurality of second NOR logic gates comprises
inputs connected to the respective associated subset of the plurality of word lines that are connected to the corresponding one of the plurality of first NOR logic gates, and
an output electrically coupled to the second end portion of the respective source line that is connected to the corresponding one of the plurality of first NOR logic gates, the output being configured to generate the respective source-driving signal (VSL) for biasing the respective source line.

11. The address decoder according to claim 10, wherein each of the plurality of first NOR logic gates comprises:
a NOR logic-combination circuit configured to implement an operation of a NOR logic combination of the row-driving signals (VWL) of the associated subsets of the plurality of word lines and supplies a logic-combination signal (WLNOR) on a first internal node;
a first logic-inverter circuit, having its input connected to the first internal node and its output connected to a second internal node, on which it supplies the negated version of the logic-combination signal (WLNORn); and
a second logic-inverter circuit, having its input connected to the second internal node and its output connected to the output of the respective first NOR logic gate, on which it supplies the NOR output signal (SNOR) for generation of the respective source-driving signal (VSL) for biasing the respective source line.

12. The address decoder according to claim 1, wherein the source-decoder circuit comprises a logic-combination circuit comprising a plurality of AND logic gates, and wherein each of the AND logic gates comprises an output directly connected to a source line of the plurality of source lines.

13. A non-volatile memory device comprising:
a memory array comprising memory cells arranged in a plurality of word lines and a plurality of bit lines, wherein
each memory cell comprises a memory element and an access element, wherein each access element includes a MOS transistor to enable access to the respective source terminals of the MOS transistors of a same word line of the plurality of word lines are connected to respective source lines of a plurality of source lines of the memory array, and
a total number of the plurality of source lines of the memory array is greater than or equal to a total number of the plurality of word lines of the memory array; and
an address decoder coupled to the memory array and configured to address and bias the memory cells of the memory array, the address decoder comprising
a row-decoder circuit configured to select and bias word lines of the plurality of word lines with row-driving signals (VWL),
a column-decoder circuit configured to select and bias the bit lines of the plurality of bit lines of the memory array with column-driving signals (VBL), and
a source-decoder circuit configured to generate source-driving signals (VSL) for biasing the plurality of source lines of the memory array based on a logic combination of row-driving signals (VWL) of associated subsets of the plurality of word lines.

14. The device according to claim 13, wherein the memory cells of said memory array are of the PCM (Phase-Change Memory) type.

15. The device according to claim 13, wherein the source-decoder circuit comprises a logic-combination circuit comprising a plurality of AND logic gates, and wherein each of the AND logic gates comprises an output directly connected to a source line of the plurality of source lines.

16. A method for biasing a non-volatile memory device, the method comprising:
selecting and biasing word lines of a plurality of word lines of a memory array with row-driving signals (VWL), the memory array comprising memory cells arranged using the plurality of word lines and a plurality of bit lines, wherein
each memory cell comprises a memory element and an access element, wherein each access element includes a MOS transistor configured to be controlled for enabling access to the memory element,
respective source terminals of the MOS transistors of the access elements of the memory cells of a same word line are connected to respective source lines of a plurality of source lines of the memory array, and
a total number of the plurality of source lines of the memory array is greater than or equal to a total number of the plurality of word lines of the memory array;
selecting and biasing the bit lines of the plurality of bit lines of the memory array with column-driving signals (VBL); and
generating source-driving signals (VSL) for biasing the source lines of the plurality of source lines of the memory array according to a logic combination of row-driving signals (VWL) of associated subsets of the plurality of word lines.

17. The method according to claim 16, wherein generating source-driving signals (VSL) comprises carrying out a NOR logic combination of the row-driving signals (VWL) of the associated subsets of the plurality of word lines.

18. The method according to claim 17, wherein subsets of the plurality of source lines are electrically shorted in groups, and wherein generating the source-driving signals (VSL) further comprises:
generating a NOR output signal (SNOR) according to the row-driving signals (VWL) of each of the plurality of word lines that are adjacent to source lines of the group; and
generating the respective source-driving signal (VSL) for biasing the source lines of each group as an AND logic combination of the NOR output signals (SNOR) of each respective group and of the adjacent groups of source lines.

19. The method according to claim 16, wherein subsets of the plurality of source lines are electrically shorted in groups, and wherein generating the source-driving signals (VSL) comprises:
generating a NOR output signal (SNOR) according to the row-driving signals (VWL) of each of the plurality of word lines that are adjacent to source lines of the group; and
generating the respective source-driving signal (VSL) for biasing the source lines of each group as an AND logic combination of the NOR output signals (SNOR) of each respective group and of the adjacent groups of source lines.

20. The method according to claim 16, wherein subsets of the plurality of source lines are electrically shorted in groups, and wherein each subset comprises a number of source lines that is at least three and is less than the total number of the plurality of source lines.

* * * * *

UNITED STATES PATENT AND TRADEMARK OFFICE
CERTIFICATE OF CORRECTION

PATENT NO. : 10,115,462 B2
APPLICATION NO. : 15/474607
DATED : October 30, 2018
INVENTOR(S) : Polizzi et al.

It is certified that error appears in the above-identified patent and that said Letters Patent is hereby corrected as shown below:

In the Claims

In Column 12, Lines 42-43, Claim 13, delete "to enable access to the respective source terminals" and insert --to enable access to the memory element, respective source terminals--.

Signed and Sealed this
Twelfth Day of March, 2019

Andrei Iancu
*Director of the United States Patent and Trademark Office*